(12) United States Patent
Kuroda et al.

(10) Patent No.: US 6,171,730 B1
(45) Date of Patent: Jan. 9, 2001

(54) EXPOSURE METHOD AND EXPOSURE APPARATUS

(75) Inventors: Ryo Kuroda, Kawasaki; Tsutomu Ikeda, Hachiohji; Yasuhiro Shimada, Hadano, all of (JP)

(73) Assignee: Canon Kabushiki Kaisha, Tokyo (JP)

( * ) Notice: Under 35 U.S.C. 154(b), the term of this patent shall be extended for 0 days.

(21) Appl. No.: 09/184,655

(22) Filed: Nov. 3, 1998

(30) Foreign Application Priority Data

Nov. 7, 1997 (JP) .................................................... 9-322231
Dec. 24, 1997 (JP) .................................................... 9-355336

(51) Int. Cl.$^7$ .................................................... G03F 9/00
(52) U.S. Cl. .................................................... 430/5
(58) Field of Search ................................. 430/5, 30, 322; 355/73, 76, 53

(56) References Cited

U.S. PATENT DOCUMENTS 5,737,064 * 4/1998 Inoue et al. ............................. 355/73

FOREIGN PATENT DOCUMENTS 8-179493   7/1996   (JP) .

* cited by examiner

*Primary Examiner*—S. Rosasco
(74) *Attorney, Agent, or Firm*—Fitzpatrick, Cella, Harper & Scinto

(57) ABSTRACT

An exposure apparatus and method for transferring a pattern to an object to be exposed by exposure to evanescent light using a mask having an aperture pattern having a width of 100 nm or less. The mask is arranged opposite to the object to be exposed, and pressure is applied to the mask arranged opposite to the object from the side of the mask opposite to the surface facing the object to generate evanescent light under the pressure applied, to transfer the pattern of the mask to the object to be exposed by exposure to the evanescent light.

26 Claims, 9 Drawing Sheets

EXPOSURE METHOD AND EXPOSURE APPARATUS

BACKGROUND OF THE INVENTION

1. Field of the Invention

The present invention relates to an exposure apparatus and an exposure method. Particularly, the present invention can be preferably applied to an evanescent light exposure apparatus used for fine processing having a size on the order of 100 nm or less.

2. Description of the Related Art

For a photolithographic apparatus having the limit of fine processing (at present, about 0.1 µm by using a near ultraviolet laser), which is limited by the wavelength of the light used, a fine processing apparatus has recently been proposed, which uses the construction of a near-field optical microscope (referred to as an "SNOM" hereinafter) as a means for permitting fine processing of a size smaller than that provided by the wavelength of the light used. An example of such an apparatus is an apparatus capable of locally exposing a resist by using evanescent light leaking from a fine aperture having a size on the order of 100 nm or less, beyond the processing limit, which is otherwise set by the wavelength of the light used. However, such a lithographic apparatus having the SNOM construction has a problem in that productivity is hardly improved because one processing probe is (or several processing proves are) used for fine processing.

As a method to solve this problem, a proposal has been made to provide a prism on an optical mask, with light being incident on the prism at an angle producing total reflection, to transfer a pattern of the optical mask to a resist at the same time by using evanescent light leaking from the total reflection surface (refer to Japanese Patent Laid-Open No. 8-179493).

In the batch exposure apparatus disclosed in Japanese Patent Laid-Open No. 8-179493, in which the prism is provided for exposure to evanescent light, the distance between the surfaces of the prism and the mask to the resist is thought to be preferably set to 100 nm or less. This is because the evanescent light leaking from the surfaces of the prism and the mask exponentially attenuates as the distance from the surfaces of the prism and the mask increases. However, since the surface precision or flatness of the surfaces of the prism and mask and the substrate, or the parallelism between the surfaces of the prism and mask and the substrate, etc., are limited, it is difficult to set the distance between the surfaces of the prism and mask and the resist surface to 100 nm or less over the entire surface of the prism and the mask. This produces a problem of nonuniformity in the exposed pattern, or causes a partial crushing of the resist by the surfaces of the prism and the mask.

SUMMARY OF THE INVENTION

Accordingly, an object of the present invention is to provide an exposure apparatus and an exposure method capable of easily performing batch exposure at the exposure light wavelength or less.

In a first aspect, the present invention provides an exposure apparatus for transferring a pattern to an object to be exposed by exposure using a mask having a width of 10 nm or less. The apparatus includes contact means for bringing a first surface of the mask into contact with the object to be exposed by elastically deforming the mask, and irradiation means for irradiating a second surface of the mask, which is brought into contact with the object to be exposed, the second surface being opposite to the first surface.

In another aspect, the present invention provides a mask for transferring a pattern to an object to be exposed by exposure. The mask includes a substrate having a thickness of about 0.1 to about 100 µm, a metal thin film provided on the substrate and having a thickness of about 10 to 100 nm, and an aperture pattern provided on the metal thin film and having a width of about 100 nm or less.

In still another aspect, the present invention provides an exposure method for transferring a pattern to an object to be exposed by exposure using a mask having an aperture pattern having a width of about 100 nm or less. The method includes the steps of bringing a first surface of the mask into contact with the object to be exposed by elastically deforming the mask, and irradiating a second surface of the mask, which is brought into contact with the object to be exposed, the second surface being opposite to the first surface.

In yet another aspect, the present invention provides a method of transferring a pattern to an object to be exposed by exposure. The method of the present invention includes the steps of providing a mask including (i) a substrate having a thickness of about 0.1 to about 100 nm, (ii) a metal thin film provided on the substrate and having a thickness of about 10 to 100 nm, and (iii) an aperture pattern provided on the metal thin film and having a width of about 100 nm or less, and transferring a pattern to the object by exposure using the mask, the object having a surface on which a resist film is formed by a Langmuir-Blodgett's method.

In still another aspect, the present invention provides a method of transferring a pattern to an object to be exposed by exposure. The method of the invention includes the steps of providing a mask including (i) a substrate having a thickness of about 0.1 to about 100 nm, (ii) a metal thin film provided on the substrate and having a thickness of about 10 to 100 nm, and (iii) an aperture pattern provided on the metal thin film and having a width of about 100 nm or less, and transferring a pattern to the object by exposure using the mask, the object having a surface on which a resist film is formed by a self-alignment single molecular film forming method.

In still another aspect, the present invention provides an exposure apparatus for exposing a pattern on a mask to an object by using evanescent light. The apparatus includes a pressure difference applying structure for generating a pressure difference between a first surface of the mask and a second surface of the mask, which is opposite to the first surface, a stage for supporting and arranging the object opposite to the first surface of the mask, with an interface therebetween, and a light source for emitting light to the second surface of the mask at an angle of total reflection in the interface between the first surface of the mask and the object to be exposed.

In yet a further aspect, the present invention provides a mask including a first surface, opposite to an object to be exposed, with an interface therebetween, a second surface, opposite to the first surface, which is irradiated with light to transfer a pattern to the object by exposure using evanescent light, a mother material, and an aperture pattern provided in the mother material. The mask is adhered to the object, and during adhesion, the refractive index of the mother material is higher than the refractive index of the constituent material of the object to be exposed, in the interface between the surface of the mask and the object.

In yet still another aspect, the present invention provides an exposure method for exposing a mask pattern to an object to be exposed by using evanescent light. The method includes the steps of arranging the mask opposite to the object, applying pressure to the mask, which is arranged opposite to the object, from the side of the mask, which is opposite to the side of the mask facing the object, generating evanescent light under the applied pressure, and transferring the pattern of the mask onto the object by exposure to the evanescent light.

Further objects, features and advantages of the present invention will become apparent from the following description of the preferred embodiments.

DESCRIPTION OF THE PREFERRED EMBODIMENTS

Figure 1A:
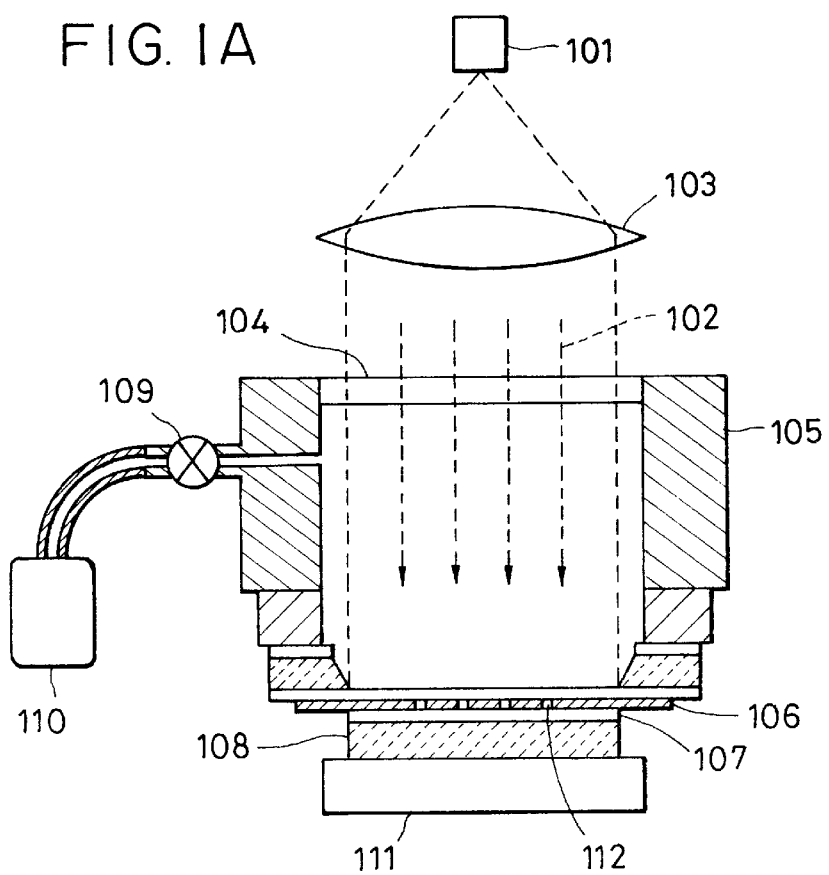
FIGS. 1A and 1B are drawings showing an evanescent light exposure apparatus in accordance with a embodiment and a modified first embodiment of the present invention, respectively.

FIG. 1A shows the construction of an exposure apparatus using evanescent light in accordance with a first embodiment of the present invention. Referring to FIG. 1A, the exposure apparatus comprises an evanescent light mask 106 used as an exposure mask, and a substrate 108 to be processed. The evanescent light mask 106 includes a metal pattern 112 and is arranged so that the surface side shown in the lower portion of the drawing faces the outside of a pressure vessel 105, and the back side shown in the upper portion of the drawing faces the inside of the pressure vessel 105. The pressure vessel 105 is connected to a high pressure gas container 110 through a pressure control valve 109 so that the pressure in the pressure vessel 105 can be controlled.

The substrate 108 to be exposed has a resist 107 coated on the surface thereof and is mounted on a stage 111. The substrate 108 is then two-dimensionally aligned relative to the evanescent light mask 106 by driving the stage 111. After relative alignment is completed, the substrate 108 is driven in the direction normal to the mask surface by the stage 111 so that the surface side of the evanescent light mask 106 is brought "into contact" with the surface of the resist 107 on the substrate 108 with a distance of 100 nm or less therebetween over their entire surfaces.

After both surfaces are contacted each other, a laser beam 102, which is emitted from an exposure laser 101 and made into a parallel light beam by a collimator lens 103, is introduced into the pressure vessel 105 through a glass window 104. The introduced light beam is incident on the back side of the evanescent light mask 106 arranged in the pressure vessel 105, i.e., the upper side thereof, to expose the resist 107 to the evanescent light leaking from the metal pattern 112 arranged on the surface side of the evanescent light mask 106.

Figure 4:
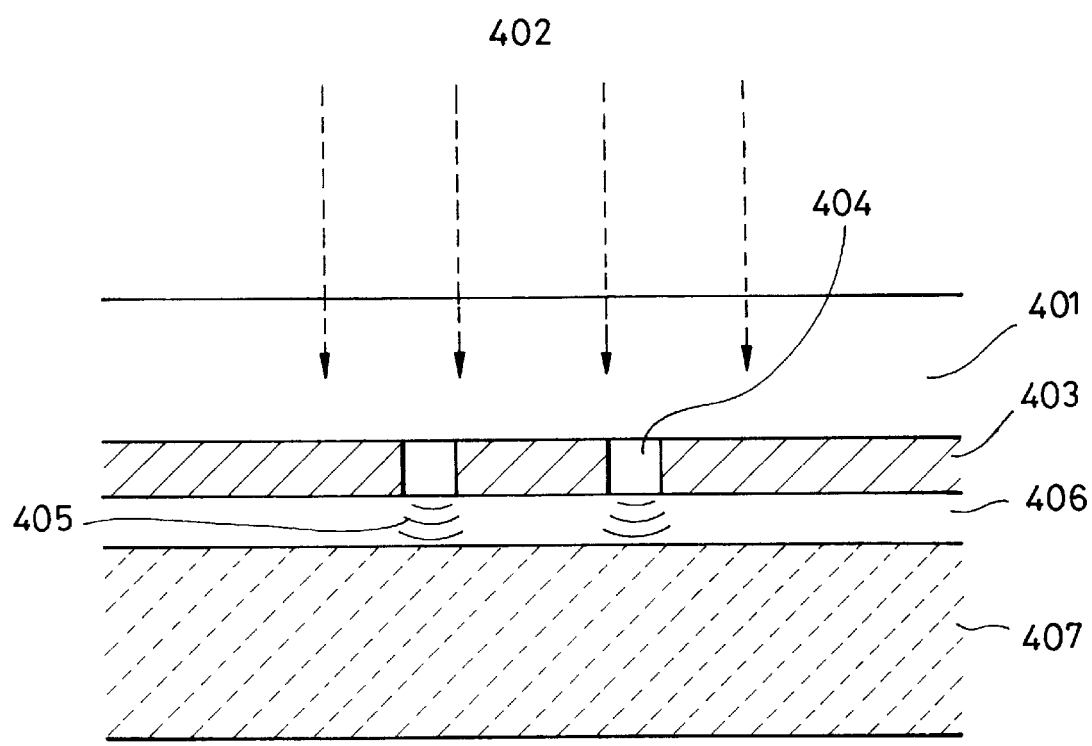
FIG. 4 is a drawing illustrating the principle of exposure to evanescent light.

The principle of exposure to evanescent light is described with reference to FIG. 4. In FIG. 4, the laser light 402 incident on a mask mother material is applied to micro apertures 404 formed in a metal pattern 403. The micro apertures 404 have a size (width) on the order of 100 nm or less, which is smaller than the wavelength of the laser light 402.

Generally speaking, a light beam does not pass through an aperture having a size smaller than the wavelength of the light beam. However, evanescent light 405 leaks slightly in the vicinities of the apertures. The evanescent light is non-propagating light, present only in the vicinities of the apertures at a distance of about 100 nm or less therefrom, and significantly attenuates as the distance from the apertures increases. When a substrate 407, coated with a resist is brought near the fine apertures 404 from which the evanescent light 405 leaks, the evanescent light 405 is scattered in the resist 406 to expose the resist 406.

With the resist 406 having a sufficiently small thickness, the evanescent light is less scattered in the resist 406, and thus, a micro pattern corresponding to the micro apertures 404 having a size smaller than the wavelength of the laser light 402 can be transferred to the resist 406 by exposure.

After exposure to the evanescent light 405, the substrate 407 is processed using standard techniques. For example, after development, the resist can be etched to form a micro pattern in the substrate 407 corresponding to the micro apertures 404.

The method of bringing the evanescent light mask into contact with the resist and the substrate is described in detail below with respect to FIG. 1A.

If the surface of the evanescent light mask 106 and the surface of the resist 107 on the substrate 108 are completely flat, both can contact each other over their entire surfaces. However, in fact, the mask surface and the surface of the resist and the substrate have irregularities or waviness. Thus, bringing both surfaces in simple contact therebetween creates a condition in which contact portions and noncontact portions are intermixed.

Therefore, in this embodiment, pressure is applied to the back of the evanescent light mask 106 in the direction toward the surface side thereof to flex the evanescent light mask 106 due to elastic deformation, so that the mask 106 is pressed onto the resist 107 and the substrate 108 to bring both members into contact with each other over their entire surfaces.

In the first embodiment shown in FIG. 1A, in which pressure is applied, the back side of the evanescent light mask 106 faces the inside of the pressure vessel 105, into which high pressure gas is introduced to increase pressure to a value higher than atmospheric pressure. This causes the evanescent light mask 106 to come into contact with the resist 107 and the substrate 108 under uniform pressure over their entire surfaces.

The contact state is controlled by controlling the pressure in the pressure vessel to control the pressure between the evanescent light mask 106 and the resist 107 and the substrate 108, i.e., the amount of contact therebetween. With the mask surface and the surface of the resist and the substrate having a slightly large irregularity or waviness, the pressure in the pressure vessel is set to a higher value to increase the contact force, thereby removing nonuniformity in the distance between the mask surface and the surface of the resist and the substrate due to the irregularity or waviness.

Figure 1B:
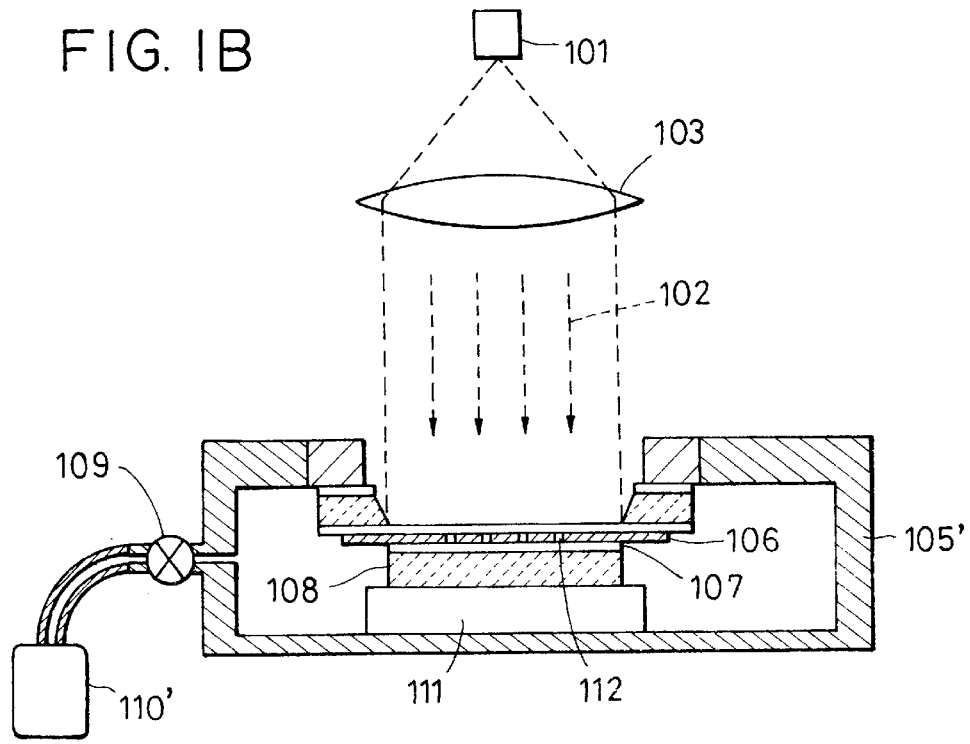

Conversely, as in a variation of the first embodiment, the surface side of the evanescent light mask 106 and the surface of the resist and the substrate may be arranged in a pressure reducing vessel. Such a variation of the first embodiment is shown in FIG. 1B. In this embodiment, pressure is applied to the back side of the evanescent light mask 106 toward the surface side thereof due to a pressure difference between the pressure in a pressure reducing vessel 105' and higher atmospheric pressure, to increase the contact between the evanescent light mask 106 and the resist 107. With the mask surface and the surface of the resist and the substrate having a slightly large irregularity or waviness, the pressure in the pressure reducing vessel can be set to a low value to increase the contact force, thereby removing any nonuniformity in the distance between the mask surface and the surface of the resist and substrate.

In the above-described first embodiment, a pressure difference is produced by making the pressure on the back side of the evanescent light mask 106 higher than that on the surface side thereof to improve the contact, thereby enabling exposure to evanescent light.

Figure 5:
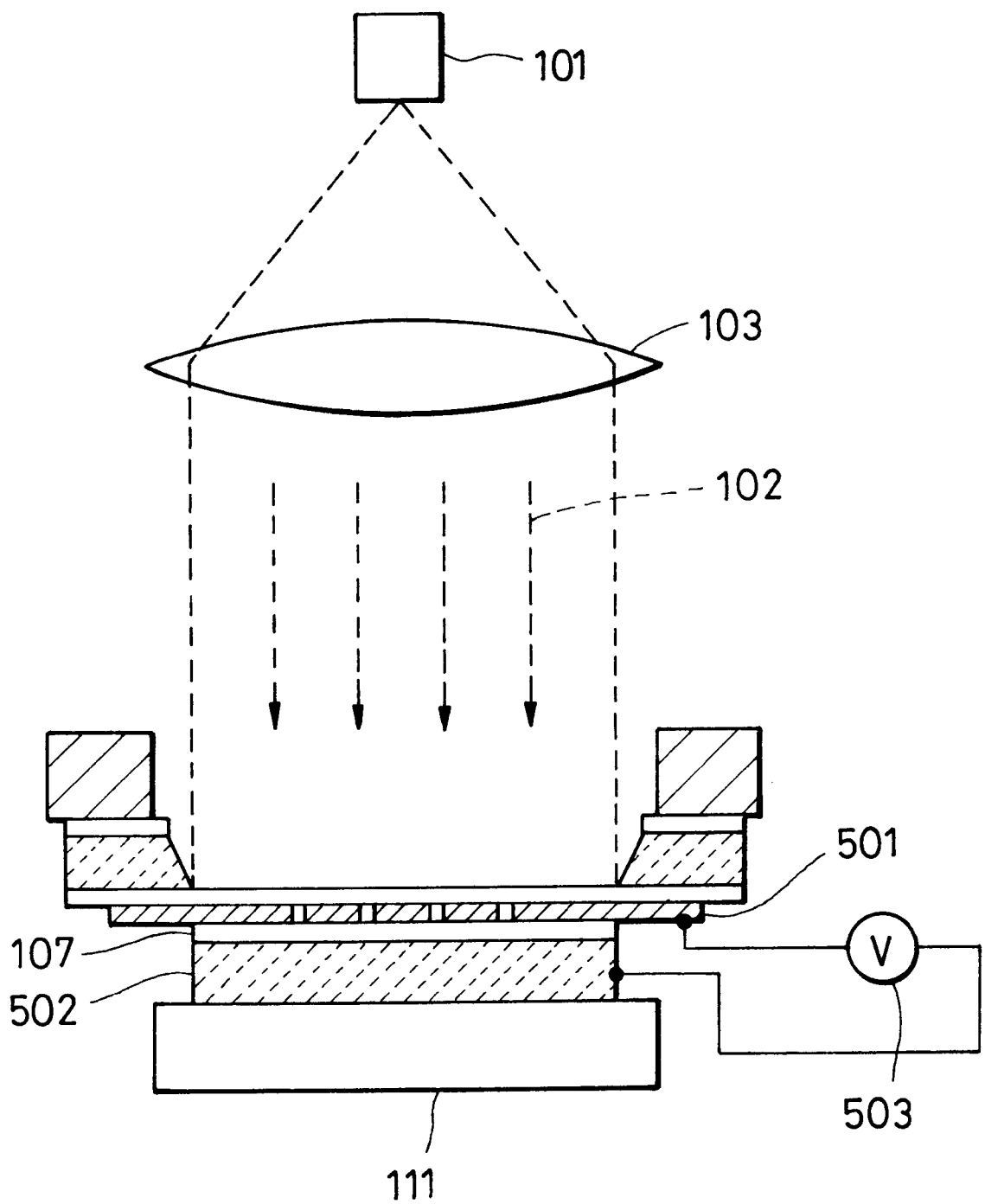
FIG. 5 is a drawing showing an evanescent light exposure apparatus in accordance with a second embodiment of the present invention.

FIG. 5 shows a second embodiment, which uses an electrostatic force for the above-described pressure applying method. A voltage applying means 503 shown in FIG. 5 applies a voltage between an evanescent light mask 501 and a substrate 502 to generate an electrostatic force therebetween. The attraction due to the electrostatic force causes contact between the evanescent light mask 501 and the substrate 502. The contact force between the evanescent light mask 501 and the resist 107 and the substrate 502 can be controlled by controlling the applied voltage.

Figure 2A:
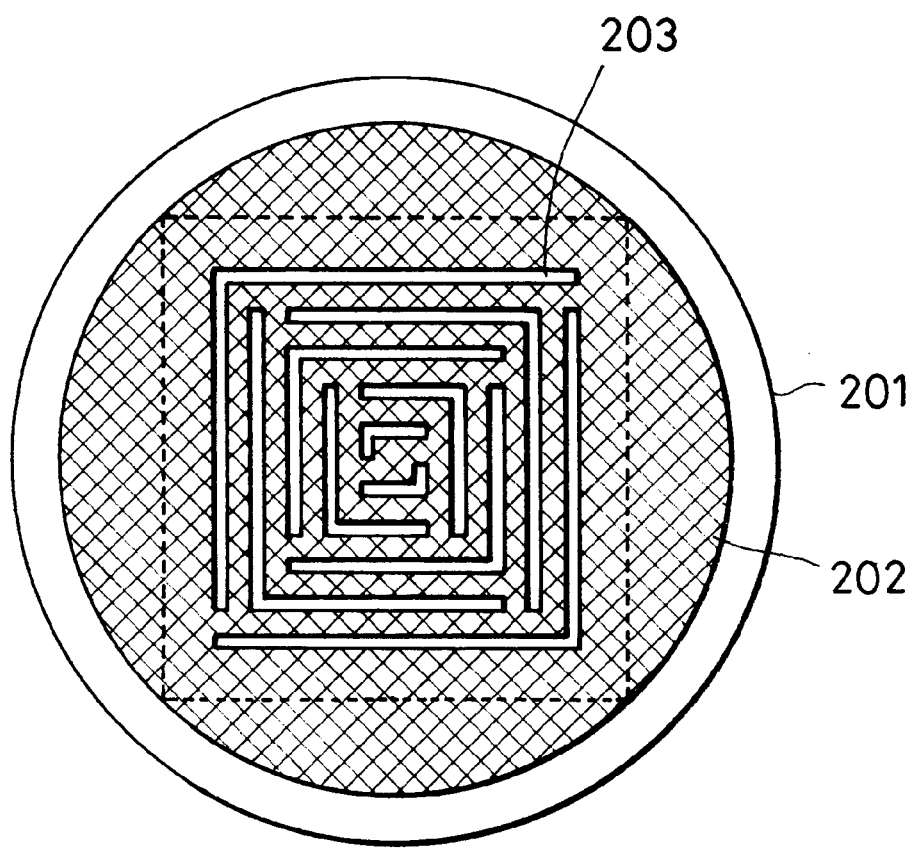
FIGS. 2A and 2B are drawings showing the construction of an evanescent light mask in accordance with an embodiment of the present invention.
Figure 2B:
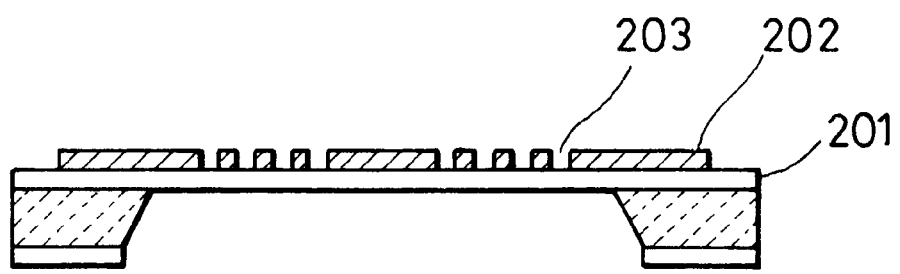

FIGS. 2A and 2B show the construction of the evanescent light mask used in the present invention. FIG. 2A is a drawing of a transfer pattern as viewed from the back side of the mask, and FIG. 2B is a sectional view. The evanescent light mask comprises a thin film of a mask mother material 201 having a thickness of about 0.1 to about 100 $\mu$m, a metal thin film 202 having a thickness of about 10 to about 100 nm and provided on the mask mother material 201, and a micro aperture pattern 203 having a width of 100 nm or less, which is formed in the metal thin film 202. As the mask mother material 201, an elastic material such as $Si_3N_4$, $SiO_2$, or the like, which can produce a deflection in the direction normal to the mask surface due to elastic deformation, and which is transparent at the wavelength of the exposure light, is selected.

As the thickness of the mask mother material 201 decreases, elastic deformation increases and the degree of contact increases, because elastic deformation is possible in correspondence with the irregularity or waviness of the resist/substrate surface. However, with an excessively small thickness relative to the exposure area, the strength of the mask is insufficient, and the mask is adsorbed onto and is not separated from the resist/substrate after contact exposure. Therefore, the thickness of the mask mother material 201 is preferably in the range of about 0.1 to about 100 $\mu$m.

In the metal thin film 202, the micro apertures of the micro aperture pattern 203 must have a small length in the direction normal to the mask surface in order to increase, as much as possible, the strength of the evanescent light leaking form the micro apertures on the mask. Therefore, the metal thin film 202 is preferably as thin as possible. However, when the metal thin film 202 is excessively thin, the metal thin film 202 is not continuous. This thereby causes a problem in that light leaks from portions other than the micro apertures. Therefore, the thickness of the metal thin film 202 is preferably in the range of about 10 to about 100 nm.

Another property required for the evanescent light mask is flatness. If the surface of the metal thin film 202 on the side adhered to the resist/substrate is not flat, the mask is not sufficiently adhered to the resist/substrate, causing nonuniformity in exposure. Therefore, the surface of the metal thin film 202 must be very flat with an irregularity of no more than about 100 nm, and preferably about 10 nm or less. Such flatness can be achieved by using a material such as $Si_3N_4$, $SiO_2$, or the like, which materials are described above as examples of the mask mother material.

In an exposure process using the evanescent light mask, it is necessary that the width of the micro aperture pattern formed on the surface side of the mask be smaller than the wavelength of the light used for the exposure, and the width of the desired exposure pattern to be transferred to the resist be selected from the range of about 1 to about 100 nm.

With a micro aperture pattern having a width of over 100 nm, generally, not only does the evanescent light used in the present invention pass through the mask, but also so does direct light having a higher strength pass through the mask, thereby causing variations in the quantity of light depending upon the pattern. Therefore, the width of the micro aperture pattern is preferably about 100 nm or less. With a width of 1 nm or less, exposure is possible, but the evanescent light leaking from the mask has a very low strength, requiring a long time for exposure. Thus, this is impractical. Therefore, the present invention is characterized by using only evanescent light for exposure, without using direct light.

Although the width of the micro aperture pattern is about 100 nm or less, the length of the aperture pattern is not limited, and a free pattern can be selected. FIG. 2A shows an L-shaped pattern as an example, but any desired pattern such as an S-shaped pattern or the like can be used.

Figure 3A:
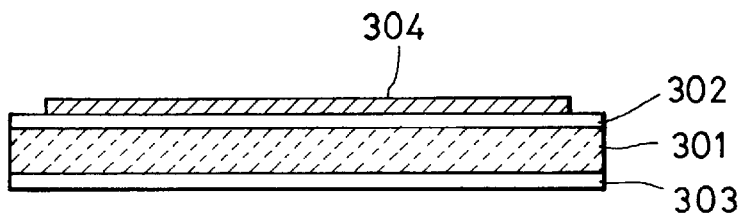
FIGS. 3A through 3E are drawings showing the method of producing an evanescent light mask.

FIGS. 3A through 3E show details of the production of the evanescent light mask. FIG. 3A shows the first step of forming $Si_3N_4$ films 302 and 303 having a thickness of about 2 $\mu$m on both the surface (the upper side in FIG. 3A) and the back (the lower side in FIG. 3A), respectively, of a double-polished Si(111) substrate 301 having a thickness of about 50 $\mu$m by an LP-CVD method. Then, on the $Si_3N_4$ film 302 on the surface side is deposited a CR thin film 304 by vapor deposition to a thickness of about 10 nm.

Figure 3B:
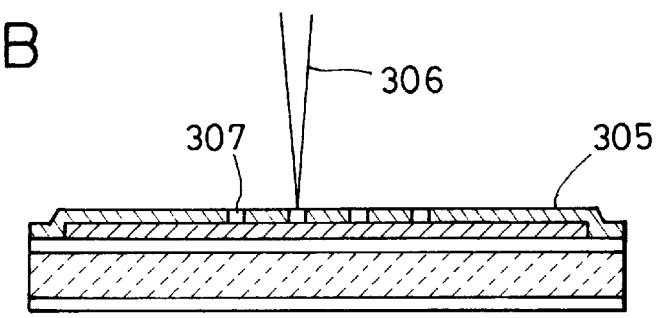
Figure 3C:
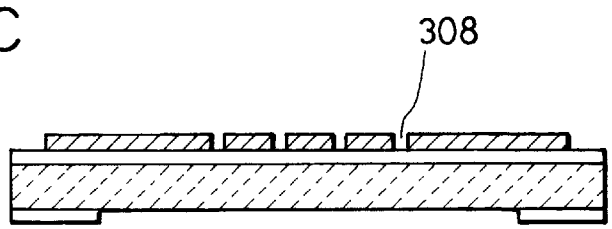

In the second step, as shown in FIG. 3B, an electron beam resist 305 is coated on the surface, and exposed to an electron beam 306 to form a plotted pattern 307 having a width of about 10 nm. After development of the exposed electron beam resist, the resist is etched with $CCl_4$ to form a micro aperture pattern 308 in the Cr thin film 304. As shown in FIG. 3C, on the back of the $Si_3N_4$ film 304 is further formed an etching window.

Figure 3D:
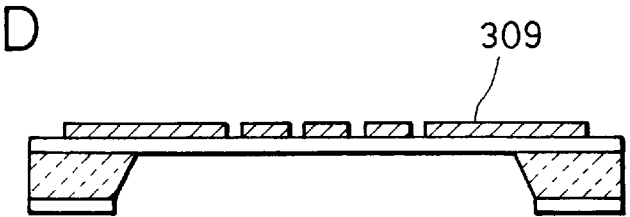
Figure 3E:
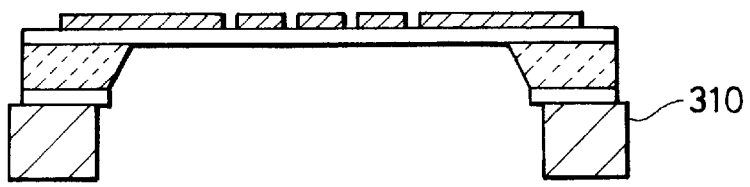

Then, as shown in FIG. 3D, the back of the Si substrate 301 is subjected to anisotropic etching with KOH to form a thin film mask 309. Finally, the mask is bonded to a mask supporting member 310 to obtain a complete device, as shown in FIG. 3E.

As a substrate 108 to be processed by the exposure apparatus using evanescent light in accordance with the present invention, a variety of substrates including semiconductor substrates of Si, GaAs, InP, and the like; insulating substrates of glass, quartz, BN, and the like; these substrates on which a metal, an oxide, a nitride, or the like is deposited; and the like can be used. However, in the exposure method and exposure apparatus of the present invention, it is important to adhere the evanescent light mask to the resist/substrate with a distance of at most about 100 nm or less, preferably about 10 nm or less, therebetween, over the entire exposure region. Therefore, it is preferable to select as flat a substrate as possible.

Similarly, the surface of the resist used in the present invention is preferably flat and has reduced irregularity. Since the evanescent light leaking from the mask exponentially attenuates as the distance from the mask increases, it is difficult to expose the resist up to a depth of 100 nm or more. Also, the evanescent light is scattered in the resist, and thus, the width of the exposed pattern is increased. From this viewpoint, it is necessary that the thickness of the resist be about 100 nm or less, and be as small as possible.

Therefore, in the selection of the resist material and the coating method, it is preferable to select conditions for achieving high flatness so that the thickness and surface roughness of the resist is at most about 100 nm or less, preferably about 10 nm or less. An example of the method comprises dissolving a general photoresist material in a solvent which causes as low a viscosity as possible, and thinly and uniformly coating the solution by spin coating.

As another example of the resist material and coating method, a Langmuir-Blodgett's method (LB method) can be used in which a substrate is dipped a predetermined number of times in water, on the surface of which molecules of an amphipathic photoresist material having a hydrophobic group, a hydrophilic group and a functional group in its molecules are arranged to form a single molecular film, to form cumulative films of single molecular films on the substrate.

A self-alignment single molecular film forming method (SAM method) can also be used, in which a single molecular film of a photoresist material is formed by physical adsorption or a chemical bond of only a single molecular layer on the substrate in a solvent or a vapor phase.

Of these coating methods, the LB method and the SAM method are capable of forming a thin resist film having a uniform thickness and good surface flatness, and are thus methods of coating the photoresist material that are suitable for exposure using evanescent light in accordance with the present invention.

In exposure to evanescent light, it is necessary that the distance between the evanescent light mask 106 and the resist 107/the substrate 108 be kept constant at at most about 100 nm, without variations. Therefore, as the substrate used for evanescent light exposure, a substrate preferably has no pattern previously formed thereon through another lithographic process and has an irregularity of 100 nm or less.

Therefore, as an object of evanescent light exposure, a substrate essentially subjected to no other processes, e.g., a substrate in an initial state of processing, and as flat as possible, is preferred. Even in a combination of the evanescent light exposure process and another lithographic process, the evanescent light exposure process is preferably carried out as early as possible.

In FIG. 4, the strength of the evanescent light 405 leaking from the micro apertures 404 on the evanescent light mask depends upon the size of the micro apertures 404. Therefore, nonuniformity in the size of the micro apertures 404 causes nonuniformity in the degree of exposure of the resist 406, thereby causing difficulties in forming a uniform pattern. In order to avoid the problem of nonuniformity, the pattern of the micro apertures on the evanescent light mask used in an evanescent light exposure process must be made uniform.

Although the above description relates to an apparatus for batch exposure of the entire surface of the substrate to evanescent light using the evanescent light mask corresponding to the entire surface of the substrate, the concepts of the present invention are not limited to this. Rather, the present invention can be applied to a step-and-repeat type apparatus in which partial evanescent light exposure of the substrate is repeated by using an evanescent light mask smaller than the substrate, while changing the exposure portion on the substrate.

As described above, in the embodiment, a mask having a micro aperture pattern having a width of at most about 100 nm is made of an elastic material, and brought into contact with the resist and the substrate by elastic deformation of the mask, and the resist is exposed to evanescent light leaking from the micro aperture pattern to transfer the pattern of 100 nm or less to the substrate without nonuniformity over the entire surface of the mask in a batch or step-and-repeat manner.

In the above embodiment, exposure is performed by using only evanescent light, without using direct light, and thus it is possible to expose a micro pattern having a width smaller than the wavelength of the exposure light with a high efficiency under the same conditions. Since the thin mask is used and brought into contact by elastic deformation, the degree of contact is good, and a desired pattern can be formed with good resolution, without crushing the resist.

Furthermore, the exposure method is selected according to the process, thereby permitting the selection of an optimum exposure method according to the state of the substrate as the object of exposure.

Another embodiment of the present invention is described with reference to the drawings.

Figure 6:
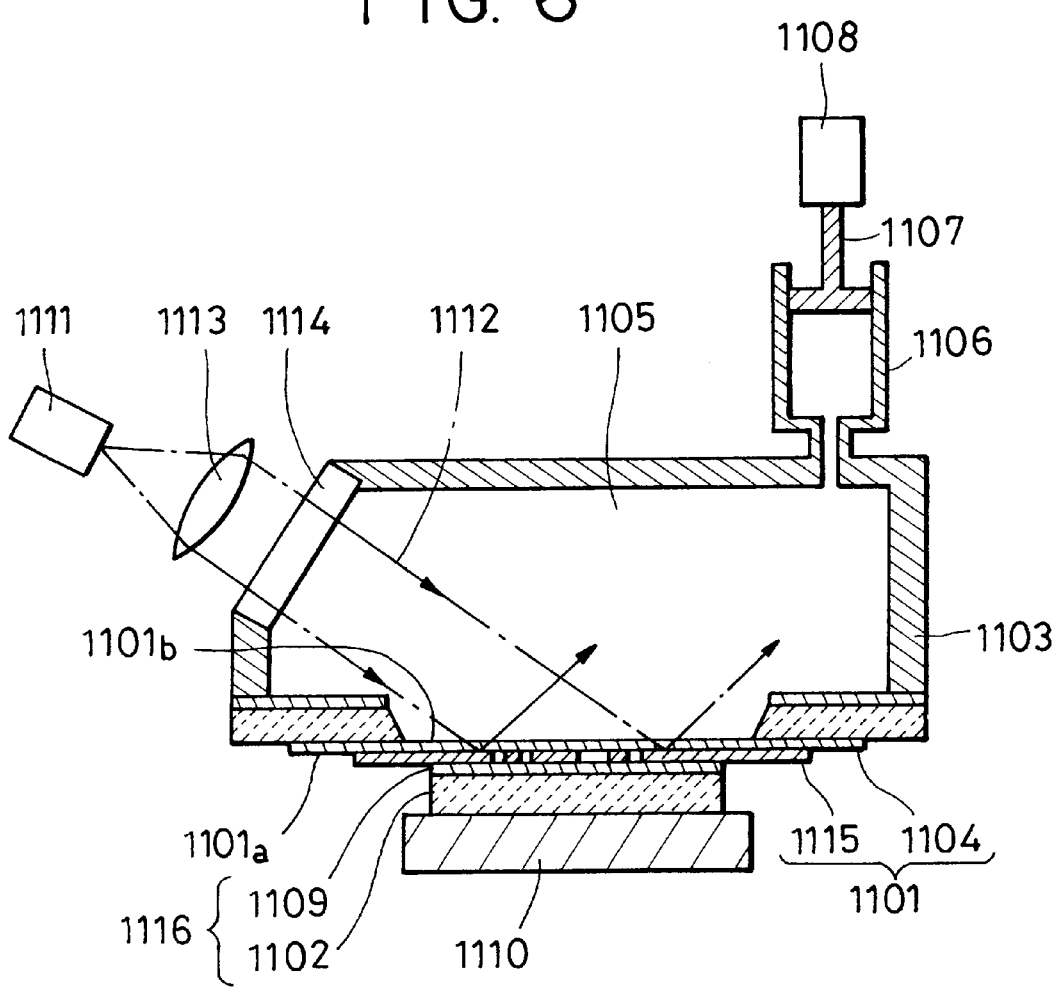
FIG. 6 is a drawing showing an evanescent light exposure apparatus in accordance with another embodiment of the present invention.

FIG. 6 is a drawing showing the construction of an evanescent light exposure apparatus in accordance with another embodiment of the present invention. In FIG. 6, cylinder 1106 is connected to a pressure vessel 1103. The cylinder 1106 is filled with an index adjusting liquid 1105. The cylinder 1106 is driven by a piston driving motor 1108 to control the pressure of the index adjusting liquid 1105 in the pressure vessel 1103. The pressure vessel 1103 also comprises a glass window 1114 for introducing a laser beam 1112, which is emitted from a laser 1111 and then made into a parallel light beam by a collimator lens 1113. A stage 1110 on which a substrate 1102 is mounted can be driven in three-dimensional directions to align the substrate 1102 with an evanescent light mask 1101. The surface of the substrate 1102 is coated with a resist 1109. In the description below, when the resist 1109 and the substrate 1102 are handled as an integrated structure, they are referred to as "the resist/substrate 1116" hereinafter.

The evanescent light mask 1101 comprises an evanescent light mask mother material 1104 and an evanescent light mask metal pattern 1115. In FIG. 6, the evanescent light mask 1101 is provided in the opening of the pressure vessel 1103 so as to seal the index adjusting liquid 1105 therein. In this state, the surface 1101a of the evanescent light mask 1101 faces the substrate 1102, and the back 1101b thereof contacts the index adjusting liquid 1105.

The procedure of exposure by the above-described evanescent light exposure apparatus will be described below.

The substrate 1102 is set on the stage 1110 with the resist 1109 as an exposure object facing upward. The stage 1110 is driven to relatively align the substrate 1102 with the evanescent light mask 1101 in the two-dimensional directions of the plane of the mask. Next, the stage 1110 is driven in the direction normal to the plane of the mask to bring the surface of the resist 1109 on the substrate 1102 into contact with the surface 1101a of the evanescent light mask 1101 with a distance of 100 nm or less therebetween over their entire surfaces.

If both the surface 1101a of the evanescent light mask 1101 and the surface of the resist 1109 on the substrate 1102 are completely flat, both surfaces can contact each other over their entire surfaces. However, the mask surface and the surface of the resist/substrate 1116 actually have unevenness or waviness. Therefore, bringing both surfaces in simple contact therebetween creates a condition in which contact portions and noncontact portions are intermixed.

In FIG. 6, a piston 1107 is pushed downward to push out the index adjusting liquid 1105 contained in the cylinder 1106 into the pressure vessel 1103, to increase the pressure in the pressure vessel 1103. Namely, a pressure higher than atmospheric pressure is applied to the back 1101b of the evanescent light mask 1101 to flex downward the evanescent light mask 1101 due to elastic deformation. As a result, the surface 1101a of the evanescent light mask 1101 is pressed on the resist/substrate 1116 to cause contact therebetween over their entire surfaces.

Such a method of applying pressure makes uniform the repulsive force acting between the surface 1101a of the evanescent light mask 1101 and the surface of the resist 1109 on the substrate 1102 due to Pascal's principle. Therefore, a large force does not locally act on the evanescent light mask 1101 and the surface of the resist 1109 on the substrate 1102, thereby preventing local destruction of the evanescent light mask 1101, the substrate 1102 and the resist 1109.

In this case, the pressure in the pressure vessel 1103 is adjusted to control the pressure acting between the evanescent light mask 1101 and the resist/substrate 1116, i.e., the contact therebetween. For example, when the surfaces of the mask and the resist/substrate 1116 have slightly large irregularities or waviness, the pressure in the pressure vessel 1103 is set to a high value to increase the degree of contact. This can prevent nonuniformity in the distance between the surfaces of the mask and the resist/substrate 1116, which is caused by the irregularities or waviness.

After the evanescent light mask 1101 is brought into contact with the resist/substrate 1116 under a uniform pressure over their entire surfaces in accordance with the above procedure, the laser light beam 1112 made into a parallel beam by the collimator lens 1113 is introduced into the pressure vessel 1103 through the glass window 1114 to be incident on the back 1101b of the evanescent light mask 1101 at an angle, which causes total reflection.

Figure 7:
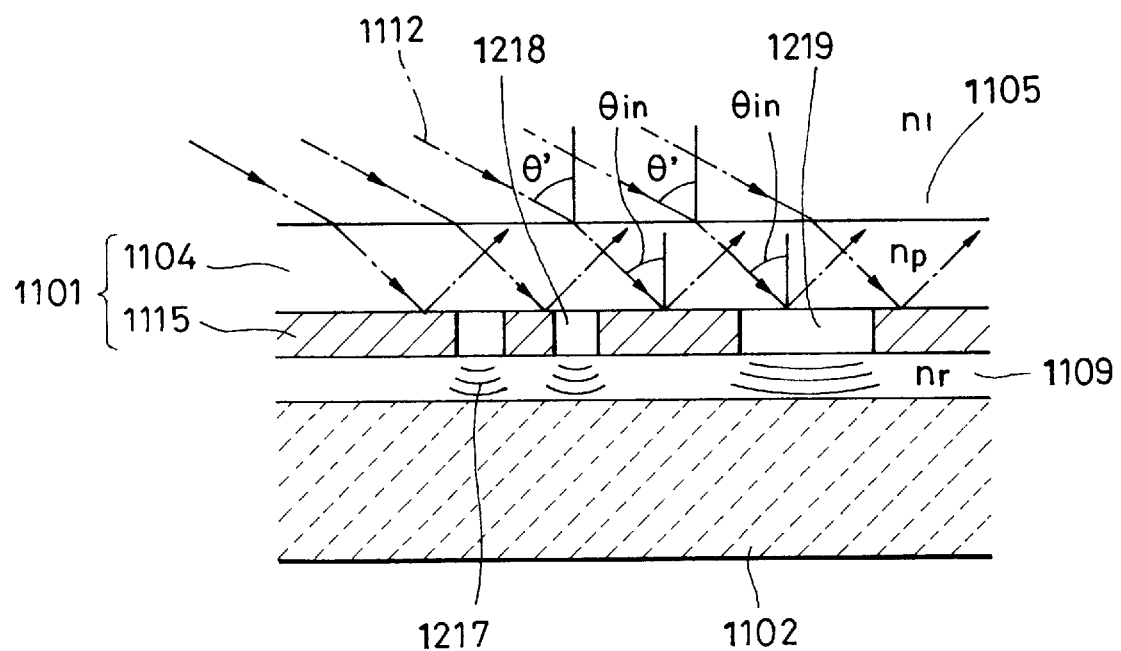
FIG. 7 is a drawing illustrating the principle of exposure to evanescent light.

FIG. 7 shows the details of total reflection of the laser light in the interface between the evanescent light mask 1101 and the resist 1109, which are brought into contact with each other. In FIG. 7, after the laser light beam 1112 incident from the index adjusting liquid side is incident on the interface between the index adjusting liquid 1105 and the evanescent light mask mother material 1104 at an incident angle θ', the laser light 1112 enters the mask mother material 1104 and is then incident on the interface between the mask mother material 1104 and the evanescent light metal pattern 1115 at an incident angle $\theta_{in}$.

In order to achieve total reflection of the laser light in the interface between the evanescent light mask 1101 and the resist 1109, which are brought into contact with each other, the relational equation (1) below is established between the refractive index $n_p$ of the evanescent light mask mother material 1104, the refractive index $n_r$ of the resist 1109 and the incident angle $\theta_{in}$ of the laser beam 1112 on the interface.

$$n_p \times \sin \theta_{in}/n_r > 1 \qquad \text{Equation (1)}$$

In an aperture pattern (for example, a first aperture pattern 1218, and a second aperture pattern 1219), spaces having the thickness of the evanescent light mask metal pattern 1115 are present between the evanescent light mask mother material 1104 and the resist 1109. However, as described in detail below, since the thickness of the evanescent light mask metal pattern 1115 is as small as about 10 to about 100 nm, and the spaces are present in the regions where evanescent light leaks, the refractive index $n_r$ of the resist 1109 is used in Equation (1), which indicates the condition of total reflection in the interface, in place of the refractive index of the substance (for example, air) present in the spaces.

In order to obtain $\theta_{in}$ which satisfies Equation (1), the following relational equation (2) is established between the refractive index $n_p$ of the evanescent light mask mother material 1104 and the refractive index $n_r$ of the resist 1109.

$$n_p > n_r \qquad \text{Equation (2)}$$

Furthermore, in order to prevent total reflection of the laser light beam in the interface between the index adjusting liquid 1105 and the evanescent light mask mother material 1104, the following relational equation (3) is established between the refractive index $n_i$ of the index adjusting liquid 1105 and the refractive index $n_p$ of the evanescent light mask mother material 1104.

$$n_i > n_p \qquad \text{Equation (3)}$$

Alternatively, the following relational equation (4) is established between the refractive index $n_i$ and the incident angle θ'.

$$n_i \times \sin \theta'/n_p < 1 \qquad \text{Equation (4)}$$

In fact, it is preferable to make the apparatus as compact as possible, and to make the exposure light close to vertical incident light. It is thus necessary that the incident angles $\theta_{in}$ and θ' of the laser light beam 1112 be small, i.e., close to a right angle to the mask. In order to satisfy this condition, materials of the evanescent light mask mother material 1104, the resist 1109 and the refractive index adjusting liquid 1105 are selected so that the refractive index $n_i$ of the index adjusting liquid 1105 is close to the refractive index $n_p$ of the evanescent light mask mother material 1104, and the refractive index $n_r$ of the resist 1109 is smaller than $n_i$ and $n_p$ by as much as possible, i.e., the following relation is satisfied.

$$n_i \sim n_p \gg n_r$$

In the actual apparatus, the index adjusting liquid 1105 is used for satisfying Equation (3) or Equation (4). As the index adjusting liquid 1105, an index matching oil frequently used for bonding optical parts is used, because the refractive index can be selected from a wide range, and the refractive index can be adjusted to be suitable for the present invention according to the mask mother material and the resist used.

In the apparatus of this embodiment shown in FIG. 6, index matching oil having a refractive index $n_i=1.8$ is used as the index adjusting liquid, $Si_3N_4$ having a refractive index $n_p$=2.0 is used as the evanescent light mask mother material 104, and a positive resist having a refractive index $n_r$ of 1.0 is used as the resist 1109. At the same time, the incident angle θ' of the laser light beam on the evanescent light mask mother material 1104 is θ'=65.50° so that the incident angle $θ_{in}$ of the laser light 1112 on the interface between the evanescent light mask 1101 and the resist 1109, which are brought into contact with each other, is $θ_{in}$=55° in order to satisfy the condition of total reflection shown by Equation (1). In this way, the laser light beam 1112 is incident on the back 1101b of the evanescent light mask 1101 and totally reflected therefrom. However, light referred to as evanescent light leaks from the evanescent light mask metal pattern 1115 on the surface side of the evanescent light mask 1101 to expose the resist 1109 using this light.

The principle of exposure to evanescent light is described below with reference to FIG. 7.

In FIG. 7, the laser light 1112 incident on the evanescent light mask mother material 1104 is incident on the first aperture pattern 1218 and the second aperture pattern 1219 formed in the evanescent light mask metal pattern 1115. In this embodiment, it is assumed that the size (width) of the first aperture pattern 1218 is 100 nm or less and smaller than the wavelength of the laser beam 1112, and the size of the second aperture pattern 1219 is larger than the wavelength of the laser beam 1112.

Generally, light does not pass through a micro aperture having a size smaller than the wavelength of the incident laser beam, as in the first aperture pattern 1218. Also, even in an aperture having a size larger than the wavelength of the incident laser beam, as in the second aperture pattern 1219, light does not pass beyond the interface under conditions of total reflection.

However, light referred to as evanescent light 1217 slightly leaks in the vicinity of the first aperture pattern 1218 and in the vicinity of the second aperture pattern 1219. This light is non-propagating light present only in the vicinity of a micro aperture at a distance of about 100 nm or less from the interface under conditions of total reflection, and has the property of rapidly attenuating as the distance from the aperture and the interface increases.

Therefore, the first aperture pattern 1218 and the second aperture pattern 1219 from which the evanescent light 1217 leaks, are brought near the resist 1109 at a distance of 100 nm or less. As a result, the evanescent light 1217 is scattered in the resist 1109 to expose the resist 1109 to scattered light.

If the thickness of the resist 1109 is sufficiently small, the evanescent light is less scattered in the resist 1109 so that pattern latent images corresponding to an aperture pattern (for example, the first aperture pattern 1218) smaller than the wavelength of light, and an aperture pattern (for example, the second aperture pattern 1219) larger than the wavelength of light can be simultaneously transferred to the resist by exposure of both patterns.

After exposure as described above, the piston shown in FIG. 6 is pulled upward to draw the index adjusting liquid 1105 in the pressure vessel 1103 into the cylinder 1106, to decrease the pressure in the pressure vessel 1103. Namely, the pressure on the back side of the evanescent light mask 1101 is reduced to a value lower than atmospheric pressure on the surface side to flex upward the evanescent light mask 1101 due to elastic deformation. As a result, the surface 1101a of the evanescent light mask 1101 is separated from the resist 1109 on the substrate 1102.

In such a method of reducing the pressure to separate the evanescent light mask 1101 from the resist/substrate 1116, a pulling force uniformly acts between the surface 1101a of the evanescent light mask 1101 and the surface of the resist 1109 on the substrate 1102. Therefore, a large force does not locally act on the surfaces of the evanescent light mask 1101 and the resist 1109 on the substrate 1102, thereby preventing local destruction of the evanescent light mask 1101, the substrate 1102 and the resist 1109 during separation. At the same time, the pressure in the pressure vessel 1103 is controlled to control the pulling force acting between the evanescent light mask 1101 and the resist/substrate 1116. For example, with a high adsorption force between the surfaces of the mask 1101 and the resist/substrate 1116, the pressure in the pressure vessel 1103 is set to a lower value to increase the pulling force, thereby facilitating separation.

In an apparatus having the reversed construction, the surface 1101a of the evanescent light mask and the resist/substrate 1116 are arranged in the pressure vessel 1103, and the applied pressure is reversed. Namely, during contact, the pressure in the pressure vessel 1103 is set to a value lower than atmospheric pressure, while during separation, the pressure in the pressure vessel is set to a value higher than atmospheric pressure. In both cases, a pressure difference may be provided so that during contact, the pressure on the surface side of the evanescent light mask 1101 is lower than the pressure on the back side, and during separation, the pressures are reversed, i.e., the pressure on the surface side is higher than the pressure on the back side.

After exposure to the evanescent light as described above, the substrate 1102 is processed using conventional techniques. For example, after development, the resist 1109 is etched to form a pattern on the substrate 1102 in correspondence with the above aperture pattern (for example, the first aperture pattern 1218 and the second aperture pattern 1219 shown in FIG. 7). This permits simultaneous formation of a pattern smaller than the wavelength of light and a pattern larger than the wavelength of light on the substrate 1102.

Figure 8A:
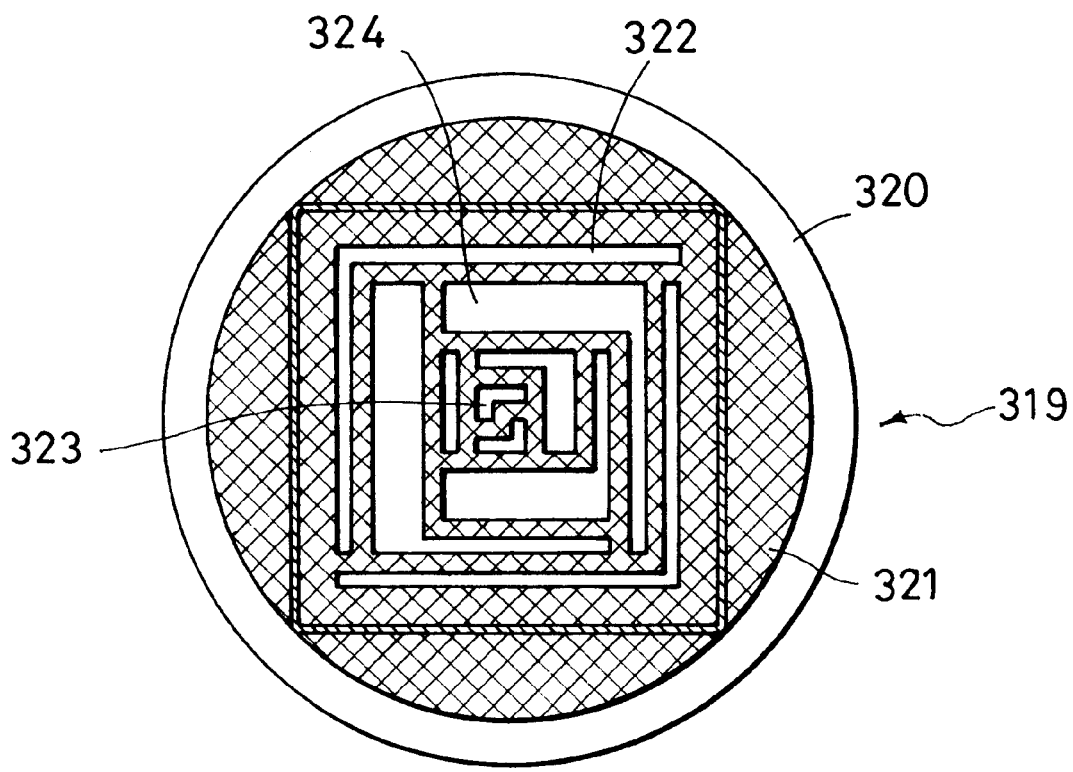
FIGS. 8A and 8B are drawings showing the construction of an evanescent light mask used in the present invention.
Figure 8B:
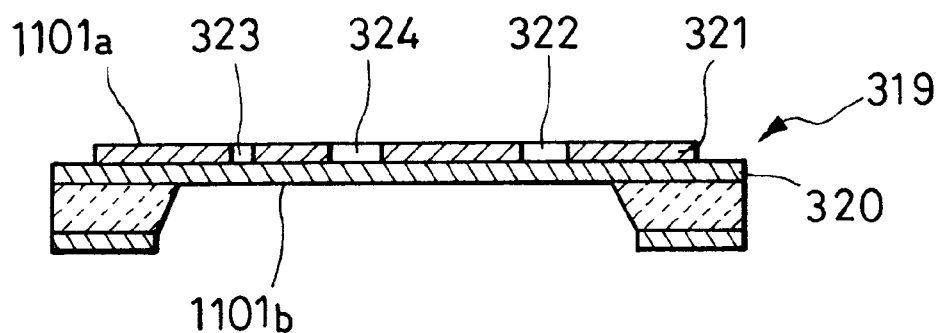

The mask is described in detail below. FIG. 1. 8A and 8B show the construction of the evanescent light mask used in the present invention. FIG. 8A is a drawing of the mask as viewed from the surface thereof, and FIG. 8B is a sectional view.

As shown in these figures, an evanescent light mask 319 comprises a mask mother material 320 comprising a thin film having a thickness of about 0.1 to about 100 μm, a metal thin film 321 having a thickness of about 10 to about 100 nm and formed on the mask mother material 320, and an aperture pattern 322, 323 and 324 formed in the metal thin film 321. As material for the mask mother material 320, an elastic material, such as $Si_3N_4$, $SiO_2$, or the like, which can produce deflection due to elastic deformation in the direction normal to the mask surface, and which is transparent and can transmit light at the exposure wavelength, is selected. As the thickness of the mask material decreases, elastic deformation increases, and the degree of contact increases because elastic deformation is possible in correspondence with the fine irregularity or waviness in the surface of the resist/substrate. However, with an excessively small thickness relative to the exposure area, the strength of the mask is insufficient, or the mask is adsorbed on the resist/substrate and is not separate therefrom after adhesion and exposure. Therefore, the thickness of the mask mother material 320 is preferably in the range of about 0.1 to about 100 μm.

In order to increase, by as much as possible, the evanescent light leaking from the aperture pattern 322 on the mask, the length of the aperture in the direction normal to the mask surface must be deceased, and thus, the thickness of the metal thin film 321 is preferably as small as possible. However, when the metal thin film 320 has an excessively small thickness, the metal thin film 320 will not be a continuous film, and light leaks from portions other than the micro apertures. Therefore, the thickness of the metal thin film 320 is preferably about 10 to about 100 nm.

If the surface of the metal thin film 321 on the side adhered to the resist/substrate is not flat, the mask is not sufficiently brought into contact with the resist/substrate, thereby causing nonuniformity in exposure. Therefore, the metal thin film 321 should be very flat and have a surface roughness of at most about 100 nm, and preferably at most about 10 nm.

The shape (width and length) and the size of the aperture pattern are not limited, and any desired shape can be selected. For example, the L-shaped pattern shown in FIG. 8A, or an S-shaped pattern may be used.

As described above, even in an aperture pattern 323 (e.g., the first aperture pattern 1218 shown in FIG. 7), which is smaller than the wavelength of the incident laser beam, evanescent light leaks, and thus, such an aperture pattern can be used as the aperture pattern on the evanescent light mask of the present invention.

Even in an aperture pattern 324 (e.g., the second aperture pattern 1219 shown in FIG. 7), which is larger than the wavelength of light, evanescent light leaks from the interface of total reflection between the surface of the evanescent light mask and the surface of the resist, and such an aperture pattern can also be used as the aperture pattern on the evanescent light mask of the present invention.

Furthermore, since exposure to evanescent light can be performed regardless of the size of the aperture pattern, no nonuniformity occurs due to the size of the aperture. Therefore, the aperture pattern on the evanescent light mask may comprise only an aperture pattern smaller than the wavelength of the incident laser beam of a combination of such an aperture pattern smaller than the wavelength of the incident laser beam and an aperture pattern larger than the wavelength of the incident laser beam.

Next, a method of forming an evanescent light mask is described in detail below with reference to FIGS. 9A though 9E.

Figure 9A:
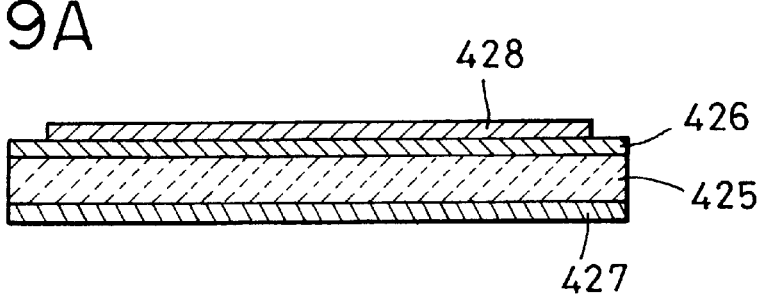
FIGS. 9A through 9E are drawings showing another example of the method of producing an evanescent light mask.

As shown in FIG. 9A, on the surface (i.e., the upper side shown in FIG. 9A) and the back (i.e., the lower side shown in FIG. 9A) of a double-polished Si(111) substrate 425 having a thickness of about 500 μm are deposited $Si_3N_4$ films 426 and 427 having a thickness of about 2 μm. On the surface of the $Si_3N_4$ film 426 is deposited, by vapor deposition, a Cr thin film 428 having a thickness of about 10 nm.

Figure 9B:
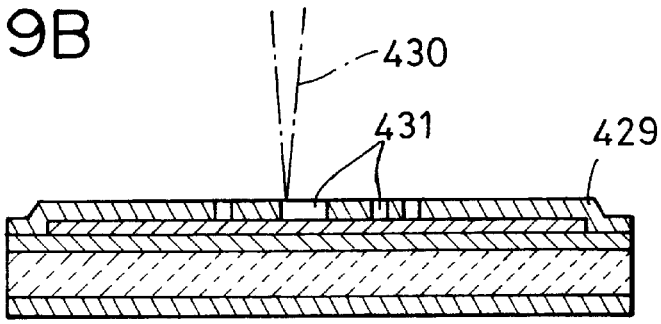

Next, as shown in FIG. 9B, an electron beam resist 429 is coated on the surface of the Cr thin film 428, and a plotted pattern 431 is formed in the electron beam resist 429 by using an electron beam 430.

Figure 9C:
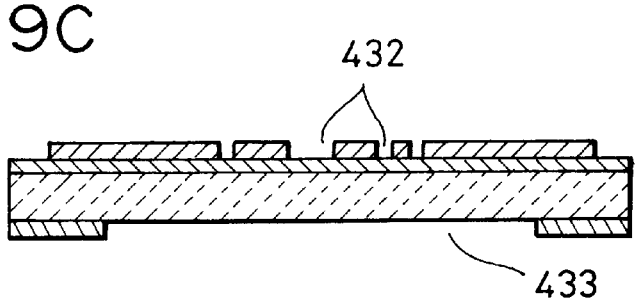

After the plotted pattern 431 is formed, the electron beam resist 429 is etched with $CCL_4$ to form an aperture pattern 432 in the Cr thin film 428, as shown in FIG. 9C. Then, on the back of the $Si_3N_4$ film 427 is formed an etching window 433.

Figure 9D:
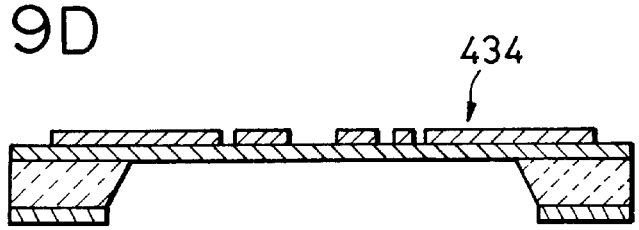
Figure 9E:
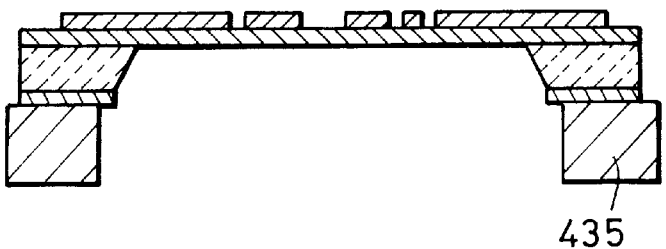

Then, the back of the Si(111) substrate 425 is subjected to anisotropic etching with KOH to form a thin film mask, as shown in FIG. 9D. Finally, the substrate 425 is bonded to a mask supporting member 435, as shown in FIG. 9E.

As the substrate 1102, which has been described above, to be processed by the evanescent light exposure apparatus of the present invention, a variety of substrates including semiconductor substrates of Si, GaAs, InP, and the like; insulating substrates of glass, quartz, BN, and the like; these substrates on which a metal, an oxide, a nitride, or the like is deposited; and the like can be used. However, in the evanescent light exposure apparatus of the present invention, it is important to bring the evanescent light mask 1101 into contact with the resist/substrate 1116 with a distance of at most about 100 nm, and preferably at most about 10 nm, therebetween, over the entire exposure region. Therefore, it is preferable to select as flat a substrate as possible as the substrate 1102. Similarly, the surface of the resist 1109 used in the present invention must be flat and must have reduced irregularity. Since the evanescent light leaking from the evanescent light mask 1101 exponentially attenuates as the distance from the mask increases, it is difficult to expose the resist 1109 up to a depth of about 100 nm or more. Also, the evanescent light is scattered in the resist, and thus, the width of the exposed pattern is increased. From this viewpoint, it is necessary that the thickness of the resist 1109 be at most about 100 nm, and be as small as possible.

Therefore, a flat resist material and a coating method are used in which the thickness is at most about 100 nm, and preferably at most about 10 nm, and the surface roughness of the resist is at most about 100 nm, and preferably at most about 10 nm.

In order to satisfy these conditions, a general photoresist material may be dissolved in a solvent so that the viscosity is as low as possible, and thinly and uniformly coated by spin coating.

As an another example of the resist material and coating method, a Langmuir-Blodgett's method (LB method) may be used in which a substrate is dipped a predetermined number of times in water, on the surface of which molecules of an amphipathic photoresist material having a hydrophobic group, a hydrophilic group and a functional group in its molecular form are arranged to form a single molecular film, to form cumulative films of single molecular films on the substrate.

A self-allgnment single molecular film forming method (SAM method) may also be used, in which a single molecular film of a photoresist material is formed by physical adsorption or a chemical bond of only a single molecular layer on the substrate in a solvent or a vapor phase.

Of these coating methods, the LB method and the SAM method are capable of forming the thin resist film having a uniform thickness and good surface flatness, and are thus methods of coating the photoresist material suitable for the evanescent light exposure apparatus of the present invention.

As described above, in exposure to evanescent light, the distance between the evanescent light mask 1101 and the resist/the substrate 1116 is preferably kept constant, at at most about 100 nm, without variations.

Therefore, as the substrate used for evanescent light exposure, a substrate having a pattern previously formed thereon through another lithographic process and having irregularities of 100 nm or more is undesirable. Therefore, a substrate essentially subjected to no other processes, e.g., a substrate in an initial state of processing, and as flat as possible, is preferred. Even in combination of the evanescent light exposure process and another lithographic process, the evanescent light exposure process is preferably carried out as early as possible.

Although the above description relates to apparatus for batch exposure of the entire surface of the substrate to evanescent light using an evanescent light mask corresponding to the entire surface of the substrate, the concepts of the present invention are not limited to this. Rather, the present invention can be applied to a step-and-repeat type apparatus in which partial evanescent light exposure of the substrate is repeated by using an evanescent light mask smaller than the substrate, while changing the exposure position on a portion of the substrate.

In the above-described embodiment, the mask is brought into contact with the resist/substrate by elastic deformation of the mask using means for generating a pressure difference, and a light beam is incident on the interface between the mask and the resist/substrate under conditions for total reflection, to expose the resist to the evanescent light leaking from the aperture pattern. As a result, a pattern having a size of about 100 nm or less, or a pattern having a size of about 100 nm or less and a pattern having a size of about 100 nm or more can be simultaneously transferred to the substrate without nonuniformity over the entire surface of the mask in a batch manner.

Except as otherwise disclosed herein, the various components shown in outline or in block form in the Figures are individually well known and their internal construction and operation are not critical either to the making or using of this invention or to a description of the best mode of the invention.

While the present invention has been described with reference to what are at present considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An exposure apparatus for transferring a pattern to an object to be exposed by exposure using a mask having a width of 100 nm or less, said apparatus comprising:

contact means for bringing a first surface of the mask into substantially uniform contact with the object to be exposed by elastically deforming the mask; and irradiation means for irradiating a second surface of the mask, which is brought into substantially uniform contact with the object to be exposed, the second surface being opposite to the first surface.

2. An apparatus according to claim 1, wherein said contact means set a pressure on the second surface of the mask to a value higher than a pressure on the first surface of the mask.

3. An apparatus according to claim 2, wherein said contact means adjusts the relation between the pressure on the second surface and the pressure on the first surface of the mask.

4. An apparatus according to claim 3, wherein said contact means comprises a pressure vessel provided on the second surface side of the mask.

5. An apparatus according to claim 3, wherein said contact means comprises a pressure reducing vessel containing an atmosphere that includes the space between the first surface of the mask and the object to be exposed.

6. An apparatus according to claim 1, wherein said contact means comprises voltage applying means for applying a voltage between the mask and the object to be exposed.

7. An apparatus according to claim 6, wherein said contact means adjusts the applied voltage.

8. An apparatus according to claim 2, wherein the pressure on the second surface of the mask is uniformly distributed over an exposure area of the second surface of the mask.

9. A mask used for transferring a pattern to an object to be exposed by exposure, said mask comprising:

a substrate having a thickness of about 0.1 to about 100 $\mu$m;

a metal thin film provided on said substrate and having a thickness of about 10 to about 100 nm; and an aperture pattern provided on said metal thin film and having a width of about 100 nm or less.

10. A mask according to claim 9, wherein said substrate is made of a material selected from $Si_3N_4$ and $SiO_2$.

11. A mask according to claim 9, wherein the width of said aperture pattern is not more than the wavelength of exposure light used for the exposure transfer using said mask.

12. An exposure method for transferring a pattern to an object to be exposed by exposure using a mask having an aperture pattern having a width of about 100 nm or less, said method comprising the steps of:

bringing a first surface of the mask into substantially uniform contact with the object to be exposed by elastically deforming the mask; and irradiating a second surface of the mask, which is brought into substantially uniform contact with the object to be exposed, the second surface being opposite to the first surface.

13. A method according to claim 12, further comprising adjusting the force of bringing the mask into contact with the object to be exposed.

14. A method according to claim 13, wherein the mask is brought into contact with the object to be exposed by pressure.

15. A method according to claim 13, wherein the mask is brought into contact with the object to be exposed by an electrostatic force.

16. A method of transferring a pattern to an object to be exposed by exposure, said method comprising the steps of:

providing a mask comprising (i) a substrate having a thickness of about 0.1 to about 100 $\mu$m, (ii) a metal thin film provided on the substrate and having a thickness of about 10 to about 100 nm, and (iii) an aperture pattern provided on the metal thin film and having a width of about 100 nm or less; and transferring a pattern to the object with a surface on which a resist film is formed by a Langmuir-Blodgett's method by exposure using the mask.

17. A method of transferring a pattern to an object to be exposed by exposure, said method comprising the steps of:

providing a mask comprising (i) a substrate having a thickness of about 0.1 to about 100 $\mu$m, (ii) a metal thin film provided on the substrate and having a thickness of about 10 to about 100 nm, and (iii) an aperture pattern provided on the metal thin film and having a width of about 100 nm or less; and transferring a pattern to the object with a surface on which a resist film is formed by a self-alignment single molecular film forming method by exposure using the mask.

18. An exposure apparatus for exposing a pattern on a mask to an object by using evanescent light, said apparatus comprising:

a pressure difference applying structure for generating a substantially uniform pressure difference between points on a first surface of the mask and points on a second surface of the mask, which points on the first surface are opposite to the points on the second surface;

a stage for supporting and arranging the object opposite to the first surface of the mask with an interface therebetween; and a light source for emitting light to the second surface of the mask at an angle of total reflection in the interface between the first surface of the mask and the object to be exposed.

19. An apparatus according to claim 18, wherein said pressure difference applying structure comprises (i) a containment vessel which has an opening for receiving the mask, and which can be closed by providing the mask therein, and (ii) one of a pressurizing mechanism and a pressure reducing mechanism for changing the pressure of a fluid contained in the vessel.

20. An apparatus according to claim 19, wherein the fluid is an index adjusting liquid.

21. An apparatus according to claim 18, wherein said pressure difference applying structure sets the pressure on the second surface of the mask to a value higher than the pressure on the first surface of the mask to bring the mask into substantially uniform contact with the object to be exposed.

22. An apparatus according to claim 18, wherein said pressure difference applying structure sets the pressure on the second surface of the mask to a value lower than the pressure on the first surface of the mask to separate the mask from the object to be exposed.

23. A mask comprising:
   a first surface, opposite to an object to be exposed, with an interface therebetween;
   a second surface, opposite to the first surface, which is irradiated with light to transfer a pattern to the object by exposure using evanescent light;
   a mother material; and
   an aperture pattern provided in the mother material,
   wherein the mask contacts with the object, and during contact, the refractive index of the mother material is higher than the refractive index of the constituent material of the object to be exposed, in the interface between the surface of the mask and the object.

24. An exposure method for exposing a mask pattern to an object to be exposed by using evanescent light, said method comprising the step of:
   arranging the mask opposite to the object;
   applying substantially uniform pressure to the mask, which is arranged opposite to the object, from the side of the mask, which is opposite to the side of the mask facing the object;
   generating evanescent light under the applied pressure; and
   transferring the pattern of the mask onto the object by exposure to the evanescent light.

25. A method according to claim 24, wherein said pressure applying step comprises adjusting the pressure of a medium contained in a pressure space arranged on the side of the mask, which is opposite to side facing the object.

26. A method according to claim 24, wherein said exposure transfer step further comprises the step of irradiating the side of the mask, which is opposite to the side facing the object.

* * * * *

UNITED STATES PATENT AND TRADEMARK OFFICE
CERTIFICATE OF CORRECTION

PATENT NO. : 6,171,730 B1　　　　　　　　　　　　　　　　　Page 1 of 1
DATED : January 9, 2001
INVENTOR(S) : Ryo Kuroda, et al.

It is certified that error appears in the above-identified patent and that said Letters Patent is hereby corrected as shown below:

Column 1,
Line 28, "proves" should be -- probes --.

Column 6,
Line 2, "form" should read -- from --.

Column 11,
Line 5, "$\theta' =65.50°$" should read -- $\theta' =65.5°$ --.

Column 14,
Line 28, "an" should be deleted.

Signed and Sealed this

Thirteenth Day of November, 2001

*Attest:*

NICHOLAS P. GODICI
*Attesting Officer*　　*Acting Director of the United States Patent and Trademark Office*